US007835175B2

(12) United States Patent
Wang

(10) Patent No.: US 7,835,175 B2

(45) Date of Patent: Nov. 16, 2010

(54) STATIC RANDOM ACCESS MEMORIES AND ACCESS METHODS THEREOF

(75) Inventor: Chia-Wei Wang, Taichung County (TW)

(73) Assignee: Mediatek Inc., Hsin-Chu (TW)

(*) Notice: Subject to any disclaimer, the term of this patent is extended or adjusted under 35 U.S.C. 154(b) by 92 days.

(21) Appl. No.: 12/249,988

(22) Filed: Oct. 13, 2008

(65) Prior Publication Data

US 2010/0091585 A1 Apr. 15, 2010

(51) Int. Cl.

*G11C 11/00* (2006.01)
*G11C 7/10* (2006.01)
*G11C 7/00* (2006.01)

(52) U.S. Cl. ............. 365/154; 365/189.02; 365/189.04; 365/190; 365/196; 365/205

(58) Field of Classification Search ................. 365/154, 365/155, 156, 189.02, 189.04, 196, 205

See application file for complete search history.

(56) References Cited

U.S. PATENT DOCUMENTS

2008/0074932 A1* 3/2008 Sumitani ............... 365/189.04

* cited by examiner

*Primary Examiner*—Ly D Pham

(74) *Attorney, Agent, or Firm*—Thomas, Kayden, Horstemeyer & Risley

(57) ABSTRACT

A static random access memory device capable of preventing stability issues during a write operation is provided, in which a memory cell is coupled to a read word line, a write word line, a read bit line, a write bit line and a complementary write bit line, and a multiplexing unit is coupled to the read bit line, the write bit line and the complementary write bit line. The multiplexing unit applies first and second logic voltages representing a logic state stored in the memory cell to the write bit line and the complementary write bit line, respectively, when the memory cell is not selected to be written by an input signal from a data driver and the read word line is activated, in which the first and second logic voltages are opposite to each other.

7 Claims, 6 Drawing Sheets

STATIC RANDOM ACCESS MEMORIES AND ACCESS METHODS THEREOF

BACKGROUND OF THE INVENTION

1. Field of the Invention

The invention relates to static random access memories, and more particularly, to static random access memories capable of preventing stability issues, such as static noise margin issues, during a write operation.

2. Description of the Related Art

Current trends in the semiconductor and electronics industry require memory devices to be made smaller, faster and require less power consumption. One reason for these trends is that more relatively small and portable personal devices are being manufactured, thereby relying on battery power. In addition to being smaller and more portable, personal devices are also requiring increased memory and more computational power and speed. In light of all these trends, there is an ever increasing demand in the industry for smaller, faster, and lower power dissipation memory cells and transistors used to provide the core functionality of the memory devices.

Semiconductor memories can, for example, be characterized as volatile random access memories (RAMs) or nonvolatile read only memories (ROMs), where RAMs can either be static (SRAM) or dynamic (DRAM) differing mainly, in the manner by which they store a state of a bit. For an SRAM, for example, each memory cell includes transistor-based circuitry that implements a bistable latch, which relies on transistor gain and positive (e.g., reinforcing) feedback so that it can only assume one of two possible states, namely an on (state 1) or off (state 2). The latch can only be programmed or induced to change from one state to the other through the application of a voltage or other external stimuli. This arrangement is desirable for a memory cell since a state written to the cell will be retained until the cell is reprogrammed.

On the other hand, DRAMs implement a capacitor that is either charged or discharged to store the on (state 1) or off (state 2) state of a cell. Capacitors discharge over time, however, and DRAMs must therefore be periodically ‘refreshed’. Also, a bistable latch can generally be switched between states much faster than the amount of time it takes to charge or discharge a capacitor.

SRAMs are a desirable type of memory for certain types of applications.

BRIEF SUMMARY OF THE INVENTION

Embodiments of a static random access memory device are provided, in which a first memory cell is coupled to a read word line, a write word line, a first read bit line, a first write bit line and a first complementary write bit line, and a second memory cell is coupled to the read word line, the write word line, a second read bit line, a second write bit line and a second complementary write bit line. A word line driving unit is coupled to the read word line and the write word line, and first and second multiplexing units are coupled to the first and second the memory cells. The word line driving unit activates the read word line for a first time interval when the second memory cell is selected to be written by an input signal from a data driver and the word line driving unit then activates the write word line in the first time interval to write the input signal from the data driver to the second memory cell.

The invention provides an embodiment of an access method for a static random access memory device, wherein the static random access memory device comprises first and second memory cells driven by a read word line and a write word line, and the first memory cell is further coupled to a first read bit line, a first write bit line and a first complementary write bit line and the second memory cell is further coupled to a second read bit line, a second write bit line and a second complementary write bit line. The method comprises activating the read word line for a first time interval when the second memory cell is selected to be written by an input signal from a data driver; and activating the write word line to write the input signal from the data driver to the second memory cell during the first time interval.

The invention provides an embodiment of a static random access memory device, in which a memory cell is coupled to a read word line, a write word line, a read bit line, a write bit line and a complementary write bit line, and a multiplexing unit is coupled to the read bit line, the write bit line and the complementary write bit line. The multiplexing unit applies first and second logic voltages representing a logic state stored in the memory cell to the write bit line and the complementary write bit line, respectively, when the memory cell is not selected to be written by an input signal from a data driver and the read word line is activated, in which the first and second logic voltages are opposite to each other.

The invention provides an embodiment of an access method for a static random access memory device, wherein the static random access memory device comprises a memory cell coupled to a read word line and a write word line, a read bit line, a write bit line and a complementary write bit line. The method comprises activating the read word line during a first time interval, applying first and second logic voltages representing an input signal from a data driver to the write bit line and the complementary write bit line, respectively, in the first time interval, and activating the write word line in the first time interval to write the first and second logic voltages on the write bit line and the complementary write bit line to the memory cell.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
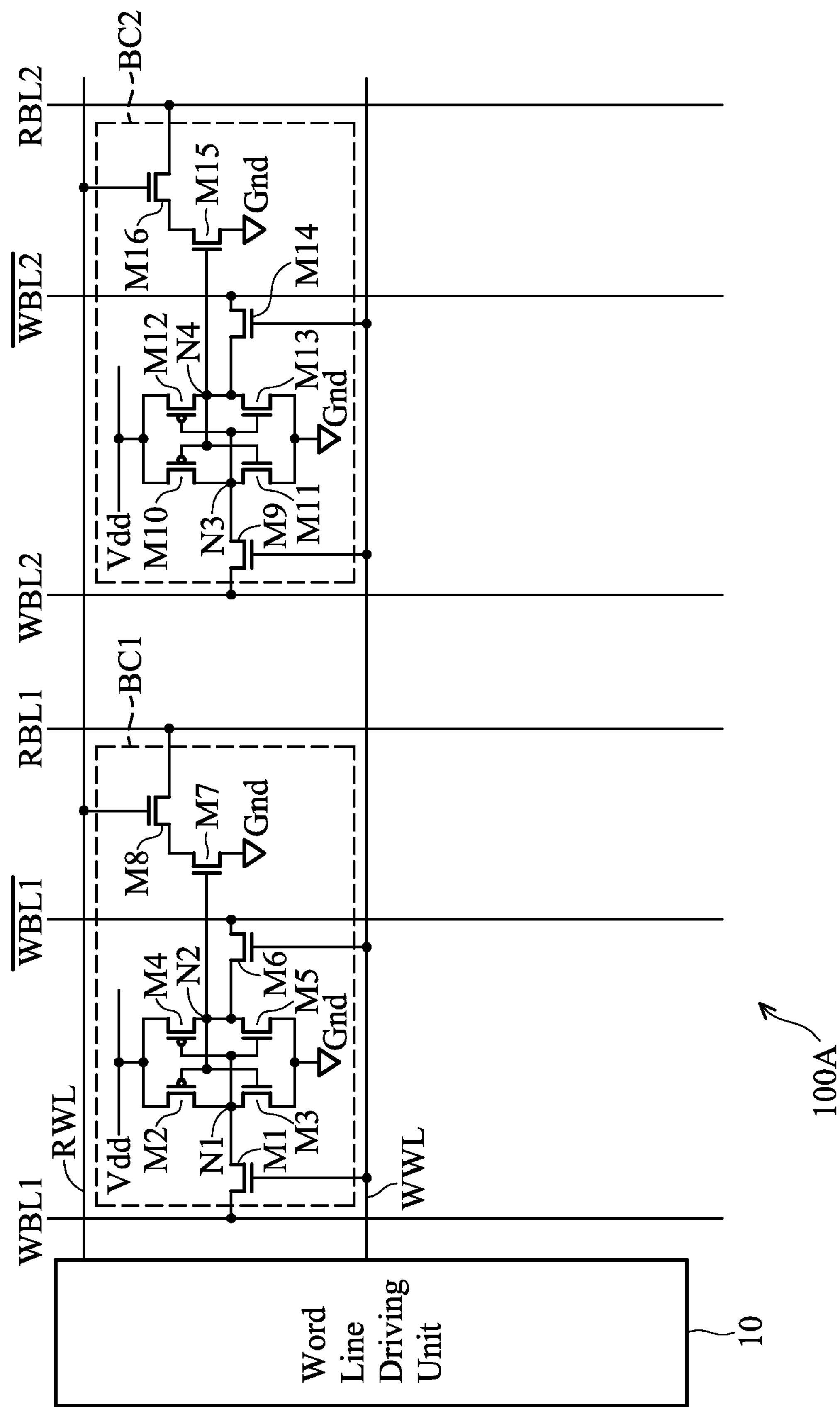
FIG. 1 is a schematic diagram of an embodiment of a static random access (SRAM)

FIG. 1 is a schematic diagram of an embodiment of a static random access memory device (SRAM) 100A mainly comprising memory cells BC1 and BC2, write bit lines WBL1, $\overline{\text{WBL1}}$, WBL2 and $\overline{\text{WBL2}}$, read bit lines RBL1 and RBL2, a read word line RWL, a write word line WWL, and a word line driving unit 10. The memory cells BC1 and BC2 each can store a logic state of a bit, in which the memory cell BC1 comprises transistors M1~M8, and the memory cell BC2 comprises transistor M9~M16, and the memory cells BC1 and BC2 are also referred to as an 8T SRAM memory cell.

The transistor M1 comprises a first terminal coupled to the write bit line WBL1, a second terminal coupled to a node N1, and a control terminal coupled to the write word line WWL. The transistor M2 comprises a first terminal coupled to a power voltage Vdd, a second terminal coupled to the node N1, and a control terminal coupled to a node N2. The transistor M3 comprises a first terminal coupled to the node N1, a second terminal coupled to a ground voltage Gnd, and a control terminal coupled to the node N2. The transistor M4 comprises a first terminal coupled to the power voltage Vdd, a second terminal coupled to the node N2, and a control terminal coupled to the node N1.

The transistor M5 comprises a first terminal coupled to the node N2, a second terminal coupled to the ground voltage Gnd, and a control terminal coupled to the node N1. The transistor M6 comprises a first terminal coupled to the node N2, a second terminal coupled to the write bit line $\overline{WBL1}$, and a control terminal coupled to the write word line WWL. The transistor M2~M5 are connected to implement a latch for storing a state of a bit. The transistor M7 comprises a first terminal coupled to the transistor M8, a second terminal coupled to the ground voltage Gnd, and a control terminal coupled to the node N2. The transistor M8 comprises a first terminal coupled to the read bit line RBL1, a second terminal coupled to the transistor M7, and a control terminal coupled to the read word line RWL. For example, the transistors M2 and M3 are implemented as an inverter and the transistors M4 and M5 are implemented as another inverter and the transistors M2~M5 can be regarded as a latch.

The transistor M9 comprises a first terminal coupled to the write bit line WBL2, a second terminal coupled to a node N3, and a control terminal coupled to the write word line WWL. The transistor M10 comprises a first terminal coupled to the power voltage Vdd, a second terminal coupled to the node N3, and a control terminal coupled to a node N4. The transistor M11 comprises a first terminal coupled to the node N3, a second terminal coupled to the ground voltage Gnd, and a control terminal coupled to the node N4. The transistor M12 comprises a first terminal coupled to the power voltage Vdd, a second terminal coupled to the node N4, and a control terminal coupled to the node N3.

The transistor M13 comprises a first terminal coupled to the node N4, a second terminal coupled to the ground voltage Gnd, and a control terminal coupled to the node N3. The transistor M14 comprises a first terminal coupled to the node N4, a second terminal coupled to the write bit line $\overline{WBL2}$, and a control terminal coupled to the write word line WWL. The transistors M10~M13 are connected to implement a latch for storing a state of a bit. The transistor M15 comprises a first terminal coupled to the transistor M16, a second terminal coupled to the ground voltage Gnd, and a control terminal coupled to the node N4. The transistor M16 comprises a first terminal coupled to the read bit line RBL2, a second terminal coupled to the transistor M15, and a control terminal coupled to the read word line RWL. For example, the transistors M10 and M11 are implemented as an inverter and the transistors M12 and M13 are implemented as another inverter and the transistors M10~M13 are regarded as a latch.

Operations of the memory cell BC1 during a read cycle is discussed hereinafter. First, the read word line RWL is activated, for example is pulled to logic high (i.e., the power voltage Vdd), the read bit line RBL1 maintains at logic high or is pulled to logic low (i.e., the ground voltage Gnd) according to the state stored in the latch (i.e., transistors M2~M5). For example, the read bit line RBL1 maintains at logic high when the logic state stored in the memory cell BC1 is logic high, i.e., the logic voltage level on the node N1 is at logic high and the logic voltage level on the node N2 is at logic low. On the contrary, the read bit line RBL1 is pulled to logic low when the logic state stored in memory cell BC1 is logic low, i.e., the logic voltage level on the node N1 is at logic low and the logic voltage level on the node N2 is at logic high. Operations of the memory cell BC2 during the read cycle is similar to that of the memory cell BC1, and thus are omitted for brevity.

Operations of the memory cell BC1 during a write cycle is discussed hereinafter. First, the write bit lines WBL1 and $\overline{WBL1}$ are pulled to logic high and logic low, respectively, and then the word line driving unit 10 activates the write word line WWL (i.e., pulls the write word line WWL to logic high). Accordingly, the transistors M1 and M6 are turned on, and the node N1 and the node N2 are pulled to logic high and logic low, respectively, i.e., the latch constructed by transistors M2~M5 stores logic “1” of a bit. On the contrary, when the write bit lines WBL1 and $\overline{WBL1}$ are pulled to logic low and logic high, respectively, the node N1 and the node N2 are pulled to logic low and logic high, respectively, i.e., the latch constructed by transistors M2~M5 stores logic “0” of a bit.

Because write bit lines WBL2 and $\overline{WBL2}$ are pulled to logic high during activation of the write word line to write the memory cell BC1, the logic state stored in the memory cell BC2 may be distorted (i.e., stability issues, such as static noise margin issues) due to semiconductor process variation.

Figure 2:
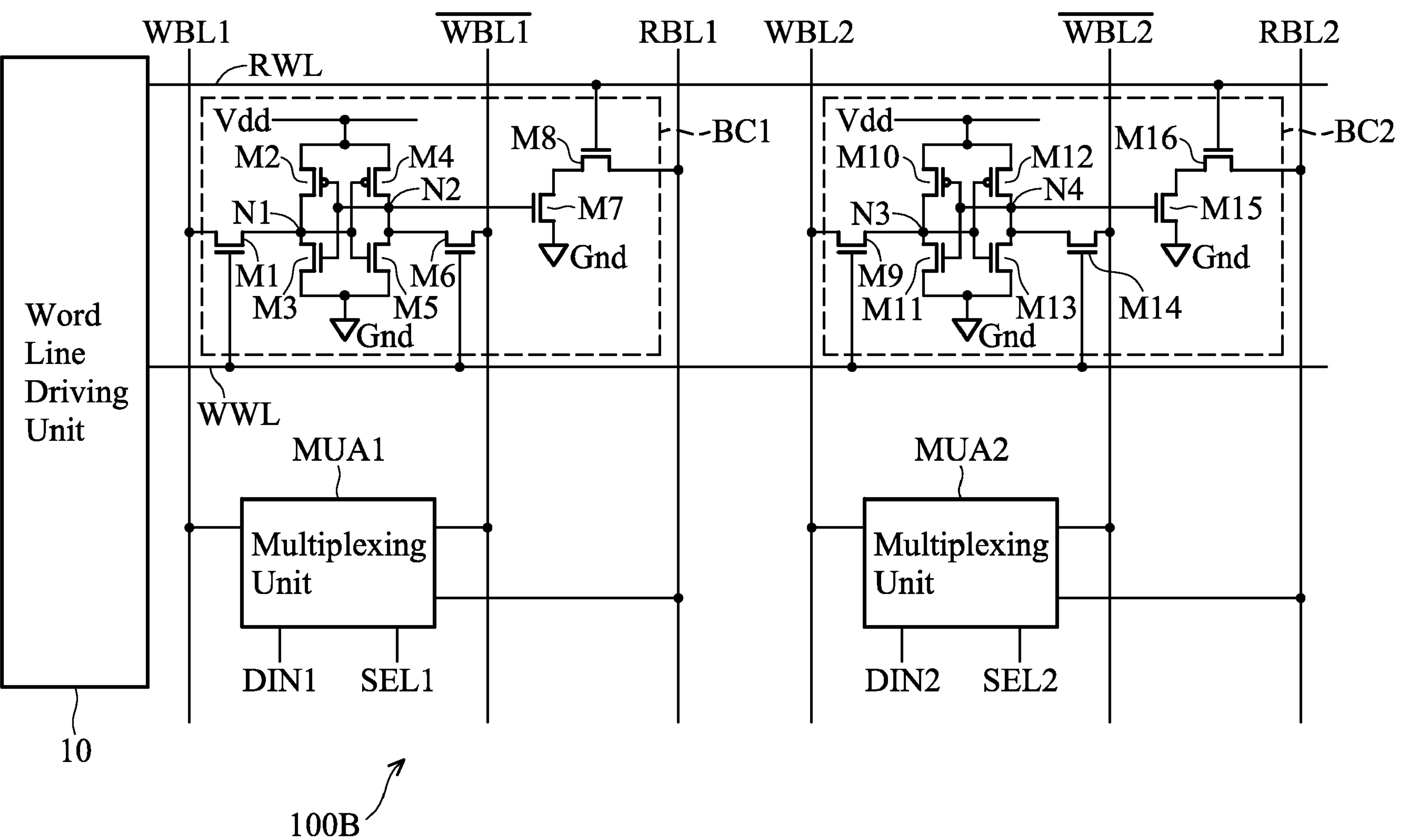
FIG. 2 shows another embodiment of the SRAM.

FIG. 2 shows another embodiment of an SRAM. As shown, the SRAM 100B is similar to the SRAM 100A shown in FIG. 1, differing only, in that two multiplexing units MUA1 and MUA2 are added to prevent stability issues caused by the write operation. Components and connection of the memory cells BC1 and BC2 are similar to that shown in FIG. 1, and thus are omitted for brevity. The multiplexing unit MUA1 is coupled to bit word lines WBL1 and $\overline{WBL1}$, read bit line RBL1 and a selection signal SEL1, and the multiplexing unit MUA2 is coupled to bit word lines WBL2 and $\overline{WBL2}$, read bit line RBL2 and a selection signal SEL2.

The multiplexing units MUA1 maintains the write bit lines WBL1 and $\overline{WBL1}$ at opposite logic voltage levels, and the multiplexing units MUA2 maintains the write bit lines WBL2 and $\overline{WBL2}$ at opposite logic voltage levels. In addition, the multiplexing units MUA1 determines the voltage level at the bit word lines WBL1 and $\overline{WBL1}$ according to the input signal DIN1 representing a logic state from a data driver (not shown) or the logic state stored in the memory cell BC1. Similarly, the multiplexing units MUA2 determines the logic voltage level at the bit word lines WBL2 and $\overline{WBL2}$ according to the input signal DIN2 representing a logic state from another data driver (not shown) or the logic state stored in the memory cell BC1.

Figure 3:
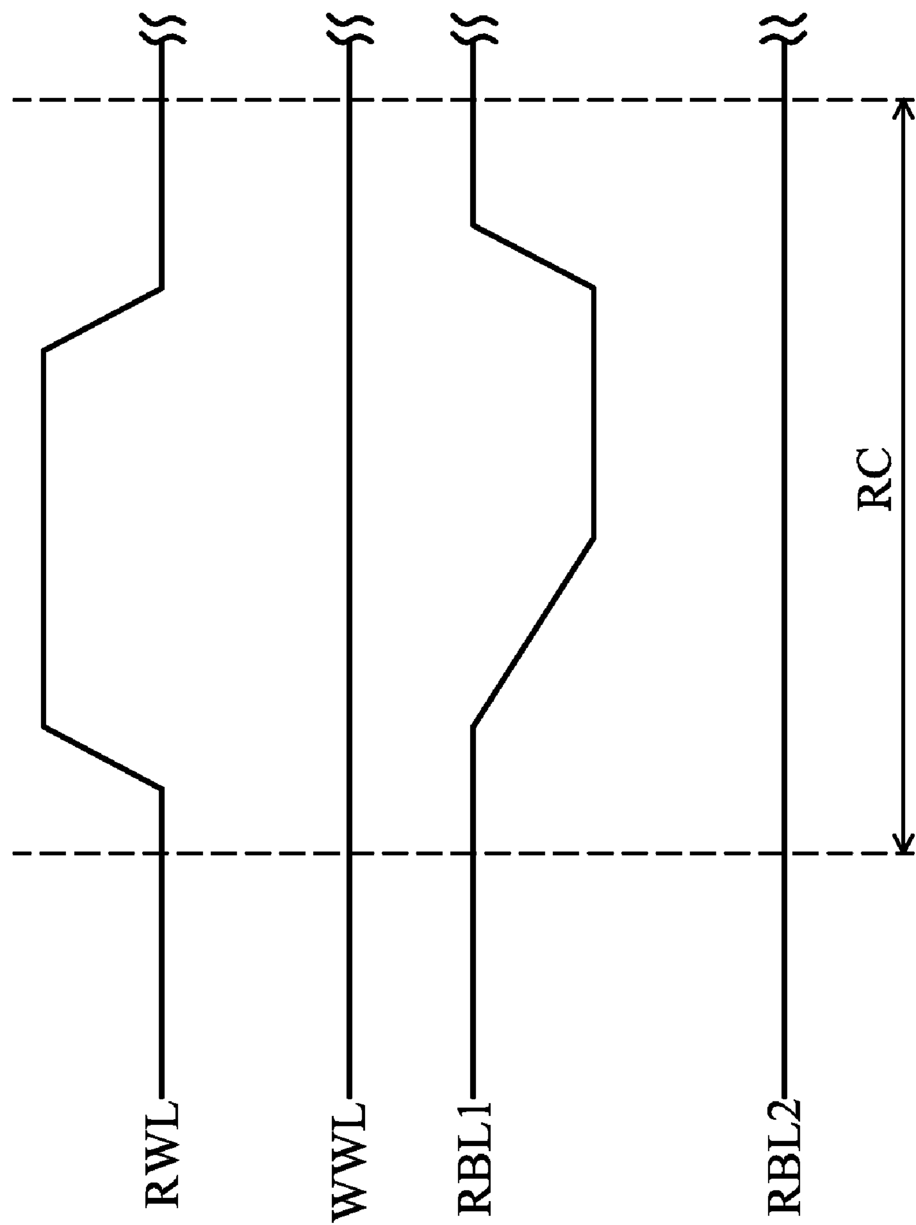
FIG. 3 is a timing chart illustrating a read cycle during an access method for the SRAM.

FIG. 3 shows a timing chart illustrating a read cycle of the SRAM according to the invention. Detailed operations of the SRAM 100B are discussed hereinafter with reference to FIGS. 2 and 3. During a read cycle RC, the word line driving unit 10 (shown in FIGS. 1 and 2) activates (i.e., pulls high) the read word line RWL, and then the read bit line RBL1 maintains at logic high or is pulled to logic low according to the logic state stored in the memory cell BC1, and the read bit line RBL2 maintains at logic high or is pulled to logic low according to the logic state stored in the memory cell BC2.

For example, after the read word line RWL is activated, the read bit line RBL1 is pulled to logic low and the read bit line RBL2 is maintained at logic high when the logic state stored in the memory cell BC1 is logic low (i.e., the logic voltage level on the node N1 is at logic low and the logic voltage level on the node N2 is at logic high) and that stored in the memory cell BC2 is logic high (i.e., the logic voltage level on the node N3 is at logic high and the logic voltage level on the node N4 is at logic low), as shown in FIG. 3. Alternatively, the read bit line RBL1 is maintained at logic high and the read bit line RBL2 is pulled to logic low when the logic state stored in the memory cell BC1 is logic high (i.e., the logic voltage level on the node N1 is at logic high and the logic voltage level on the node N2 is at logic low) and that stored in the memory cell BC2 is logic low (i.e., the logic voltage level on the node N3 is at logic low and the logic voltage level on the node N4 is at logic high). Further, the logic states stored in the memory cell BC1 and BC2 are both logic high if the read bit lines RBL1 and RBL2 are both maintained at logic high. Moreover, if the read bit lines RBL1 and RBL2 are both pulled to logic low, the logic states stored in the memory cell BC1 and BC2 are both logic low.

Figure 4:
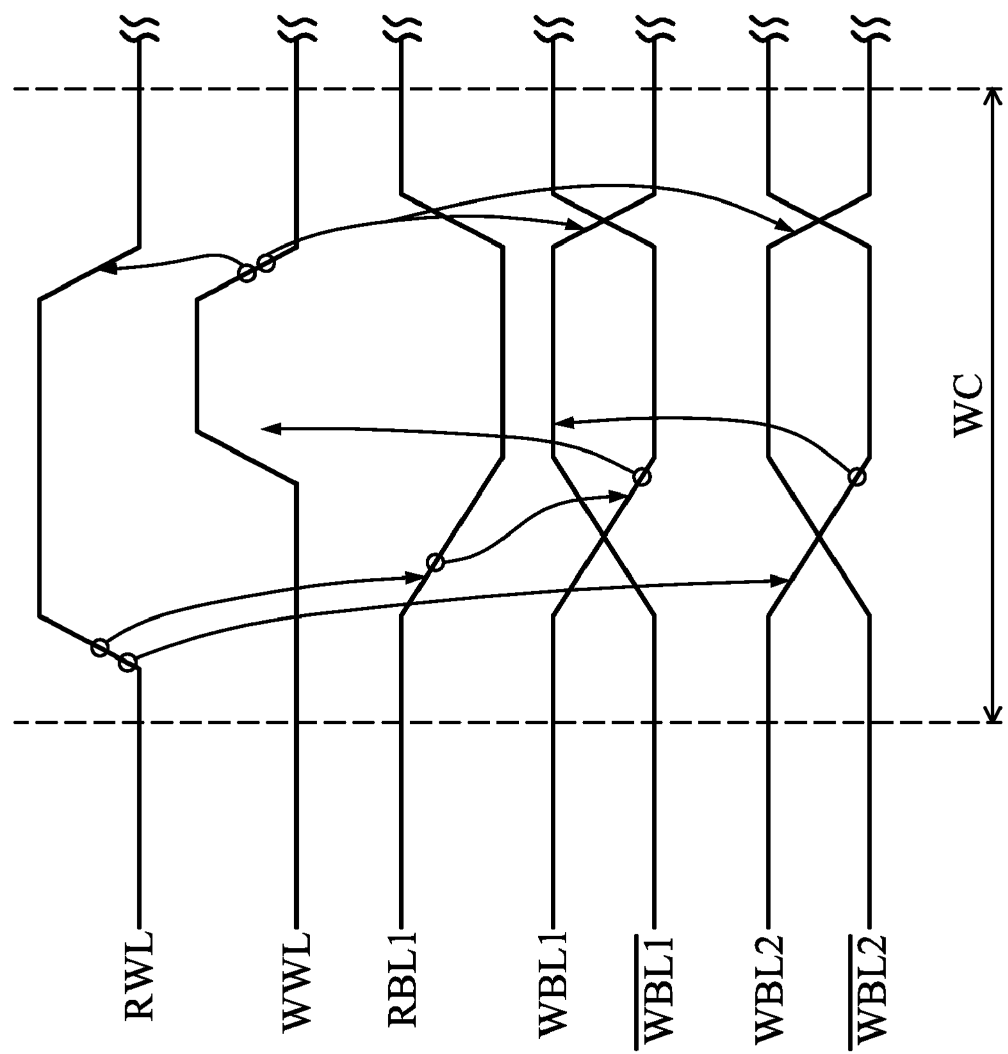
FIG. 4 is a timing chart illustrating a write cycle during an access method for the SRAM.

FIG. 4 shows a timing chart illustrating a write cycle of the SRAM according to the invention. Detailed operations of the SRAM 100B are discussed hereinafter with reference to FIGS. 2 and 4. During a write cycle WC for writing the memory cell BC2, as the selection signals SEL1 and SEL2 are deactivated and activated, respectively, the multiplexing unit MUA1 determines logic voltage levels at the write bit lines WBL1 and $\overline{\text{WBL1}}$ according to the logic state stored in the memory cell BC1 and the multiplexing unit MUA2 determines logic voltage levels at the write bit lines WBL2 and $\overline{\text{WBL2}}$ according to the input signal DIN2.

Specifically, the word line driving unit 10 first activates the read word line RWL during the write cycle WC, the read bit line RBL1 is pulled to logic low when the logic state stored in the memory cell BC1 is logic low, and the multiplexing unit MUA1 accordingly pulls the write bit lines WBL1 and $\overline{\text{WBL1}}$ to logic low and logic high, respectively. On the contrary, the multiplexing unit MUA1 pulls the write bit lines WBL1 and $\overline{\text{WBL1}}$ to logic high and logic low, respectively, if the logic state stored in the memory cell BC1 is logic high. Namely, the write bit lines WBL1 would be pulled to logic low when the logic state stored in the memory cell BC1 is logic low, and the write bit lines WBL1 would be pulled to logic high when the logic state stored in the memory cell BC1 is logic high.

At the same time, the multiplexing unit MUA2 pulls the write bit lines WBL2 and $\overline{\text{WBL2}}$ to logic low and logic high, respectively, when the input signal DIN2 represents a low logic state, because the selection signal SEL2 is activated. On the contrary, the multiplexing unit MUA2 pulls the write bit lines WBL2 and $\overline{\text{WBL2}}$ to logic high and logic low, respectively if the input signal DIN2 represents a high logic state.

Next, the word line driving unit 10 activates the write word line WWL, the transistors M9 and M14 are turned on, and the nodes N3 and N4 are pulled to logic high and logic low, respectively, i.e., the input signal DIN2 representing a high logic state is written to the memory cell BC2. When the write word line is activated, the transistors M1 and M6 are also turned on, the logic state stored in the memory cell BC1 is maintained at logic low because the write bit lines WBL1 and $\overline{\text{WBL1}}$ are logic low and logic high, respectively and the nodes N1 and N2 are logic low and logic high, respectively.

Afterwards, the word line driving unit 10 deactivates (i.e., pulls low) the write word line WWL and the read word line in sequence, and then the selection signal SEL2 is deactivated. Before ending a write cycle WC, the read bit lines RBL1 and RBL2 are both pulled to logic high, and thus, the multiplexing unit MUA1 pulls the write bit lines WBL1 and $\overline{\text{WBL1}}$ to logic high and logic low, respectively and the multiplexing unit MUA2 pulls the write bit lines WBL2 and $\overline{\text{WBL2}}$ to logic high and logic low, respectively.

Similarly, during a write cycle for writing the memory cell BC1, as the selection signals SEL1 and SEL2 are activated and deactivated, respectively, the multiplexing unit MUA1 determines voltage levels at the write bit lines WBL1 and $\overline{\text{WBL1}}$ according to the input signal DIN1 and the multiplexing unit MUA2 determines voltage levels at the write bit lines WBL2 and $\overline{\text{WBL2}}$ according to the logic state stored in the memory cell BC2. The detailed operations of the SRAM 100B during the write cycle for writing the memory cell BC1 are similar to that for writing the BC2 described above and thus are omitted for brevity.

Namely, when the memory cell BC1/BC2 is selected to be written by an input signal representing a logic state from a data driver, the logic state stored in the unselected memory cell BC2/BC1 is maintained by the corresponding multiplexing units. Hence, the logic state stored in the unselected memory cell BC2/BC1 is not distorted due to semiconductor process variation. It should be noted that, because the multiplexing units MUA1 and MUA2 can prevent from distortion caused by semiconductor process variation during write cycle, the word line driving unit 10 activates the write word line WWL by applying the power voltage Vdd or a voltage which is higher than the power voltage Vdd to the write word line WWL thereby enhancing write speed and success rate in write.

Figure 5:
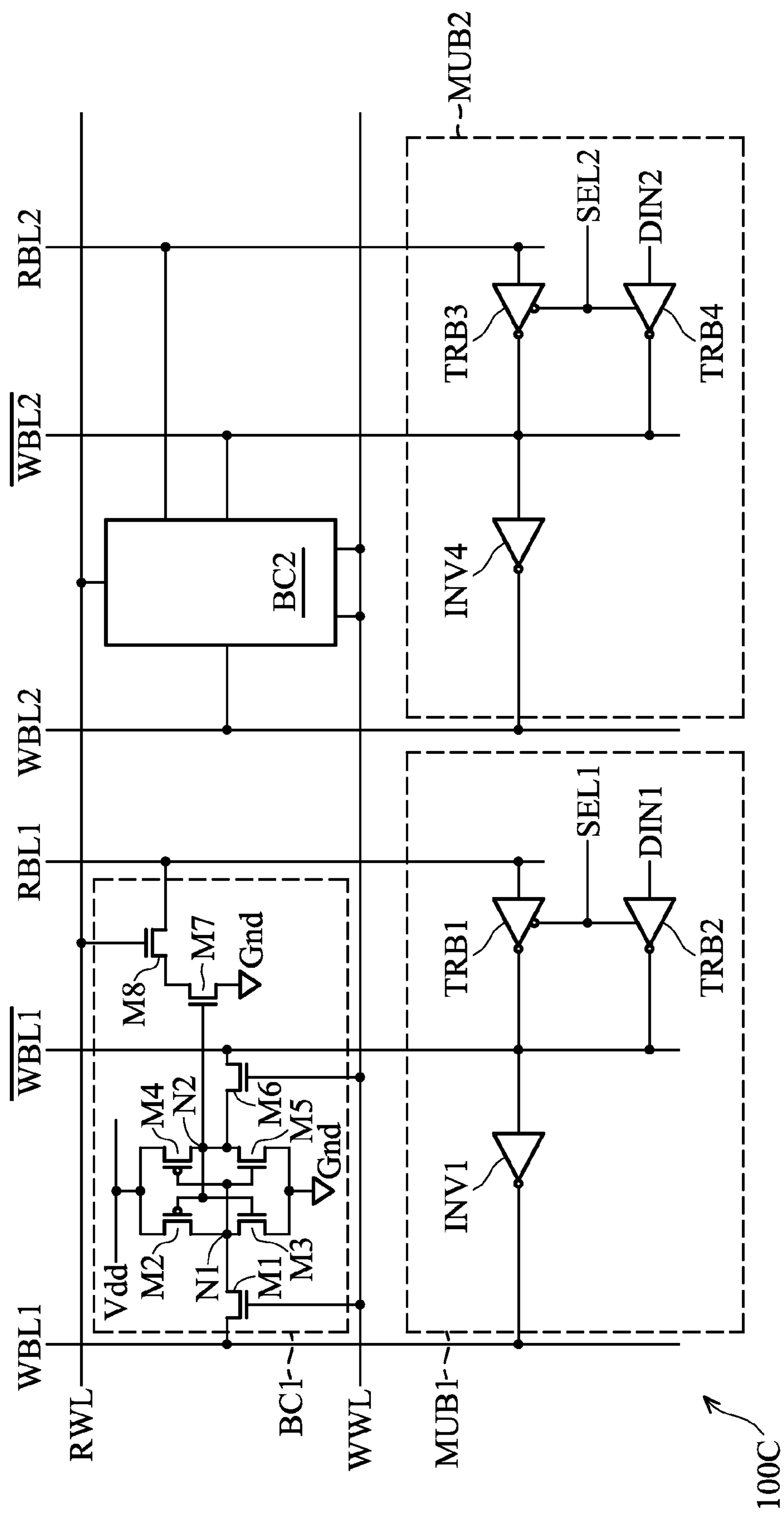
FIG. 5 shows another embodiment of the SRAM.

FIG. 5 shows another embodiment of an SRAM. As shown, the SRAM 100C is similar to the SRAM 100B shown in FIG. 2, differing only, in that the multiplexing unit MUB1 is implemented by an inverter INV1 and two tri-state buffers TRB1 and TRB2, and the multiplexing unit MUB2 is implemented by an inverter INV4 and two tri-state buffers TRB3 and TRB4.

The inverter INV1 comprises an input terminal coupled to the write bit line $\overline{\text{WBL1}}$ and an output terminal coupled to the write bit line WBL1. The tri-state buffer TRB1 comprises an input terminal coupled to the read bit line RBL1, an output terminal coupled to the write bit line $\overline{\text{WBL1}}$ and a control terminal coupled to the selection signal SEL1. The tri-state buffer TRB2 comprises an input terminal coupled to the read bit line DIN1, an output terminal coupled to the write bit line $\overline{\text{WBL1}}$ and a control terminal coupled to the selection signal SEL1. The inverter INV4 comprises an input terminal coupled to the write bit line $\overline{\text{WBL2}}$ and an output terminal coupled to the write bit line WBL2. The tri-state buffer TRB3 comprises an input terminal coupled to the read bit line RBL2, an output terminal coupled to the write bit line $\overline{\text{WBL2}}$ and a control terminal coupled to the selection signal SEL2. The tri-state buffer TRB4 comprises an input terminal coupled to the read bit line DIN2, an output terminal coupled to the write bit line $\overline{\text{WBL2}}$ and a control terminal coupled to the selection signal SEL2.

Detailed operations of the SRAM 100C during a read cycle are similar to that of the SRAM 100B shown in FIG. 2 and thus are omitted for brevity. Detailed operations of the SRAM 100C during a write cycle are discussed hereinafter with reference to FIGS. 4 and 5.

First, the word line driving unit 10 (shown in FIGS. 1 and 2) activates the read word line RWL during the write cycle WC, and the tri-state buffer TRB2 in the multiplexing unit MUB1 is disabled when the selection signal SEL1 is deactivated, such that the voltage levels on the write bit lines WBL1 and $\overline{\text{WBL1}}$ are determined according to the state stored in the memory cell BC1. For example, the read bit line RBL1 is pulled to logic low when the logic state stored in the memory cell BC1 is logic low. Consequently, the tri-state buffer TRB1 pulls the write bit line $\overline{WBL1}$ to logic high and the inverter INV1 pulls the write bit lines WBL1 to logic low. On the contrary, the tri-state buffer TRB1 pulls the write bit line $\overline{WBL1}$ to logic low and the inverter INV1 pulls the write bit lines WBL1 to logic high if the logic state stored in the memory cell BC1 is logic high.

At the same time, the tri-state buffer TRB3 in the multiplexing unit MUB2 is disabled because the selection signal SEL2 is activated, such that the voltage levels of the write bit lines WBL2 and $\overline{WBL2}$ are determined according to the input signal DIN2. For example, the tri-state buffer TRB4 pulls the write bit lines $\overline{WBL2}$ to logic high and the inverter INV4 pulls the write bit line WBL2 to logic low when the input signal DIN2 is logic low. On the contrary, the tri-state buffer TRB4 pulls the write bit line $\overline{WBL2}$ to logic low and the inverter INV4 pulls the write bit line WBL2 to logic high if the input signal DIN2 is logic high.

Next, the word line driving unit 10 activates the write word line WWL, the transistors M9 and M14 in memory cell BC2 are turned on, and the nodes N3 and N4 are pulled to logic high and logic low, respectively, i.e., the input signal DIN2 is written to the memory cell BC2. At the same time, the transistors M1 and M6 in memory cell BC1 are also turned on when write word line WWL is activated. Because the write bit lines WBL1 and $\overline{WBL1}$ are logic low and logic high, respectively and the nodes N1 and N2 are logic low and logic high, respectively, the logic state stored in the memory cell BC1 is maintained at logic low.

Afterwards, the word line driving unit 10 deactivates the write word line WWL and the read word line RWL in sequence, and then the selection signal SEL2 is deactivated and the read bit lines RBL1 and RBL2 are both pulled to logic high. At this time, because the selection signals SEL1 and SEL2 are both deactivated and the read bit lines RBL1 and RBL2 are both pulled to logic high, the tri-state buffers TRB1 and TRB3 pull the write bit lines $\overline{WBL1}$ and $\overline{WBL2}$ to logic low, and the inverters INV1 and INV4 pull the write bit lines WBL1 and WBL2 to logic high. The detailed operations of the SRAM 100C during the write cycle when the selection signals SEL1 and SEL2 are activated and deactivated, respectively, are similar to that described above and thus are omitted for brevity.

Hence, when the memory cell BC1/BC2 is selected to be written by the input signal, the state stored in the unselected memory cell BC2/BC1 is maintained by the corresponding multiplexing units. Thus, the state stored in the unselected memory cell BC2/BC1 is not distorted due to semiconductor process variation.

Figure 6:
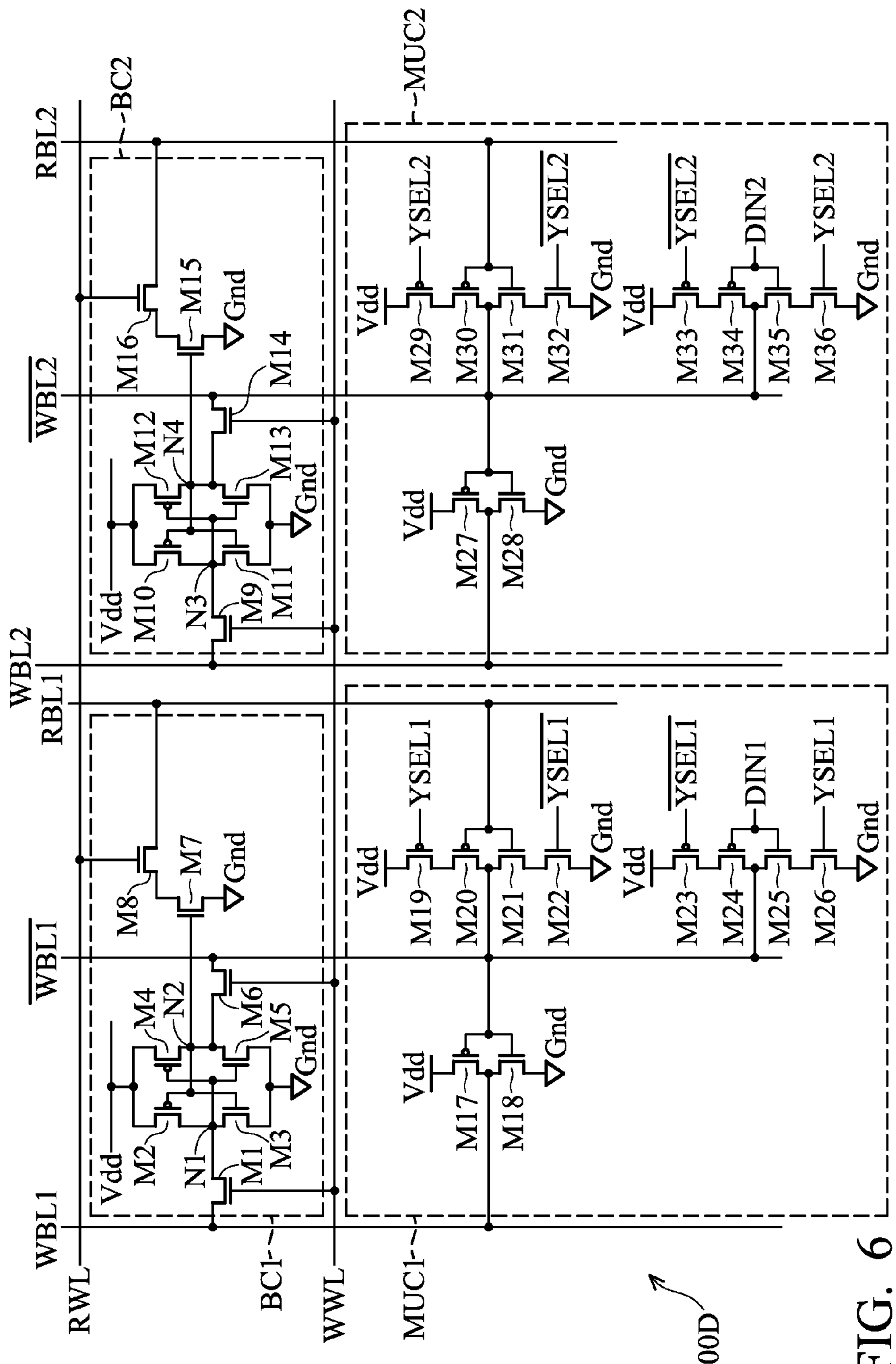
FIG. 6 shows another embodiment of the SRAM.

FIG. 6 shows another embodiment of an SRAM. As shown, the SRAM 100D is similar to the SRAM 100A shown in FIG. 1, differing only, in that the multiplexing unit MUC1 is implemented by transistors M17~M26 and the multiplexing unit MUC2 is implemented by transistors M27~M36. The transistors M17 and M18 form an inverter, and the transistors M19~M26 form two tri-state buffers. The transistor M17 comprises a first terminal coupled to the power voltage Vdd, a second terminal coupled to the write bit line WBL1, and the control terminal coupled to the write bit line $\overline{WBL1}$, and the transistor M18 comprises a first terminal coupled to the write bit line WBL1, a second terminal coupled to the ground voltage Gnd, and the control terminal coupled to the write bit line $\overline{WBL1}$.

The transistor M19 comprises a first terminal coupled to a power voltage Vdd, a control terminal coupled to a selection signal YSEL1 and a second terminal coupled to the transistor M20. The transistor M20 comprises a first terminal coupled to the second terminal of the transistor M19, a second terminal coupled to the write bit line $\overline{WBL1}$ and a control terminal coupled to the read bit line RBL1. The transistor M21 comprises a first terminal coupled to the write bit line $\overline{WBL1}$, a second terminal coupled to the transistor M22 and a control terminal coupled to the read bit line RBL1. The transistor M22 comprises a first terminal coupled to a second terminal of the transistor M21, a control terminal coupled to a complementary signal $\overline{YSEL1}$ of the selection signal YSEL1 and a second terminal coupled to the ground voltage Gnd.

The transistor M23 comprises a first terminal coupled to a power voltage Vdd, a control terminal coupled to the complementary signal $\overline{YSEL1}$ and a second terminal coupled to the transistor M24. The transistor M24 comprises a first terminal coupled to the second terminal of the transistor M23, a second terminal coupled to the write bit line $\overline{WBL1}$ and a control terminal coupled to the input signal DIN1. The transistor M25 comprises a first terminal coupled to the write bit line $\overline{WBL1}$, a second terminal coupled to the transistor M26 and a control terminal coupled to the input signal DIN1. The transistor M26 comprises a first terminal coupled to a second terminal of the transistor M25, a control terminal coupled to the selection signal YSEL1 and a second terminal coupled to the ground voltage Gnd.

The transistor M27 comprises a first terminal coupled to the power voltage Vdd, a second terminal coupled to the write bit line WBL2, and the control terminal coupled to the write bit line $\overline{WBL2}$, and the transistor M28 comprises a first terminal coupled to the write bit line WBL2, a second terminal coupled to the ground voltage Gnd, and the control terminal coupled to the write bit line $\overline{WBL2}$.

The transistor M29 comprises a first terminal coupled to a power voltage Vdd, a control terminal coupled to a selection signal YSEL2 and a second terminal coupled to the transistor M30. The transistor M30 comprises a first terminal coupled to the second terminal of the transistor M29, a second terminal coupled to the write bit line $\overline{WBL2}$ and a control terminal coupled to the read bit line RBL2. The transistor M31 comprises a first terminal coupled to the write bit line $\overline{WBL2}$, a second terminal coupled to the transistor M32 and a control terminal coupled to the read bit line RBL2. The transistor M32 comprises a first terminal coupled to a second terminal of the transistor M31, a control terminal coupled to a complementary signal $\overline{YSEL2}$ of the selection signal YSEL2 and a second terminal coupled to the ground voltage Gnd.

The transistor M33 comprises a first terminal coupled to a power voltage Vdd, a control terminal coupled to the complementary signal $\overline{YSEL2}$ and a second terminal coupled to the transistor M34. The transistor M34 comprises a first terminal coupled to the second terminal of the transistor M33, a second terminal coupled to the write bit line $\overline{WBL2}$ and a control terminal coupled to the input signal DIN2. The transistor M35 comprises a first terminal coupled to the write bit line $\overline{WBL2}$, a second terminal coupled to the transistor M36 and a control terminal coupled to the input signal DIN2. The transistor M36 comprises a first terminal coupled to a second terminal of the transistor M35, a control terminal coupled to the selection signal YSEL2 and a second terminal coupled to the ground voltage Gnd.

Detailed operations of the SRAM 100D during a read cycle are similar to that of the SRAM 100B shown in FIG. 2 and thus are omitted for brevity. Detailed operations of the SRAM 100D during a write cycle for writing memory cell BC2 are discussed hereinafter.

At first, the word line driving unit 10 (shown in FIGS. 1 and 2) activates the read word line RWL during the write cycle WC, and the tri-state buffer formed by transistors M23~M26 is disabled because the selection signal YSEL1 and its complementary signal $\overline{YSEL1}$ are logic low and logic high (i.e., the selection signal YSEL1 is deactivated), such that the voltage levels of the write bit lines WBL1 and $\overline{WBL1}$ are determined according to the logic state stored in the memory cell BC1.

For example, the read bit line RBL1 is pulled to logic low when the logic state stored in the memory cell BC1 (i.e., the voltage level at the node N1) is logic low, and thus, the transistors M19 and M20 pull the write bit lines $\overline{WBL1}$ to logic high and the transistor M18 pulls the write bit line WBL1 to logic low. Namely, the multiplexing unit MUC1 feedbacks the logic state on the read bit line RBL1 to the write bit line WBL1. On the contrary, if the logic state stored in the memory cell BC1 is high, the transistors M21 and M22 pull the write bit line $\overline{WBL1}$ to logic low and the transistor M17 pulls the write bit line WBL1 to logic high. Namely, the multiplexing unit MUC1 feedbacks the logic state on the read bit line RBL1 to the write bit line WBL1.

At the same time, the tri-state buffer formed by the transistors M29~M32 is disabled because the selection signal YSEL2 and its complementary signal $\overline{YSEL2}$ are logic high and logic low (i.e., the selection signal YSEL2 is activated), such that the voltage levels of the write bit lines WBL2 and $\overline{WBL2}$ are determined according to the input signal DIN2. For example, the transistors M33 and M34 pull the write bit line $\overline{WBL2}$ to logic high and the transistor M28 pulls the write bit line WBL2 to logic low when the input signal DIN2 represents a logic low state. On the contrary, if the input signal DIN2 represents a logic high state, the transistors M35 and M36 pull the write bit line $\overline{WBL2}$ to logic low and the transistor M27 pulls the write bit line WBL2 to logic high.

Next, the word line driving unit 10 activates the write word line WWL, the transistors M9 and M14 in memory cell BC2 are turned on, and the nodes N3 and N4 are pulled to logic high and logic low, respectively, i.e., the input signal DIN2 representing a logic low state is written to the memory cell BC2. At the same time, the transistors M1 and M6 in memory cell BC1 are turned on when the write word line WWL is activated, the logic state stored in the memory cell BC1 is maintained at logic low, because the nodes N1 and N2 are logic low and logic high respectively, and the write bit lines WBL1 and $\overline{WBL1}$ are logic low and logic high respectively.

Afterwards, the word line driving unit 10 activates the write word line WWL and the read word line RWL in sequence, and then the selection signal YSEL2 is pulled to logic low and the complementary signal $\overline{YSEL2}$ is pulled to logic high (i.e., the selection signal SEL2 is deactivated), and the read bit lines RBL1 and RBL2 are both pulled to logic high. At this time, because the selection signals SEL1 and SEL2 are both deactivated and the read bit lines RBL1 and RBL2 are both pulled to logic high, the transistors M21 and M22 pull the write bit line $\overline{WBL1}$ to logic low, the transistors M31 and M32 pull the write bit line $\overline{WBL2}$ to logic low, the transistor M17 pulls the write bit line WBL1 to logic high, and the transistor M27 pulls the write bit line WBL2 to logic high. The detailed operations of the SRAM 100C during the write cycle when the selection signals SEL1 and SEL2 are activated and deactivated, respectively, are similar to that described above and thus are omitted for brevity.

Thus, when the memory cell BC1/BC2 is selected to be written by a logic state from a data driver, the state stored in the unselected memory cell BC2/BC1 is maintained by the corresponding multiplexing units, such that the state stored in the unselected memory cell BC2/BC1 is not distorted due to semiconductor process variation during a writing cycle.

The invention also discloses an access method for an SRAM. Read operations of the access method are discussed hereinafter with reference to FIGS. 2 and 3. During a read cycle RC, the word line driving unit 10 activates the read word line RWL (i.e., pulls the read word line RWL to logic high), and then the read bit lines RBL1 maintains logic high or is pulled to logic low according to the logic states stored in the memory cells BC1 and BC2.

For example, after the read word line RWL is activated, if the read bit lines RBL1 and RBL2 are pulled to logic low and maintained at logic high respectively, the logic state stored in the memory cell BC1 is logic low and the logic state stored in the memory cell BC2 is logic high. Alternatively, the logic state stored in the memory cell BC1 is logic high and the logic state stored in the memory cell BC2 is logic low, if the read bit lines RBL1 and RBL2 are maintained at logic high and pulled to logic low respectively. Further, the logic states stored in the memory cell BC1 and BC2 are both logic high if the read bit lines RBL1 and RBL2 are both maintained at logic high. Moreover, if the read bit lines RBL1 and RBL2 are both pulled to low, the logic states stored in the memory cell BC1 and BC2 are both logic low.

Write operations of the access method are discussed hereinafter with FIGS. 2 and 4. During a write cycle WC, as the selection signal SEL2 corresponding to the memory cell BC2 is deactivated and the other selection signal, such as SEL1, is deactivated, the memory cell is selected to be written by an input signal DIN2, i.e., a logic state from a data driver. Then, the word line driving unit 10 activates the read word line RWL, such that the multiplexing unit MUA1 corresponding to the unselected memory cell, such as BC1, determines voltage levels at the write bit lines WBL1 and $\overline{WBL1}$ according to the logic state stored in the memory cell BC1 and the multiplexing unit MUA2 corresponding to the selected memory cell BC2 determines voltage levels on the write bit lines WBL2 and $\overline{WBL2}$ according to the input signal DIN2.

For example, the read bit line RBL1 is pulled to logic low when the logic state stored in the memory cell BC1 is logic low, and the multiplexing unit MUA1 pulls the write bit lines WBL1 and $\overline{WBL1}$ to logic low and logic high, respectively. On the contrary, the multiplexing unit MUA1 pulls the write bit lines WBL1 and $\overline{WBL1}$ to logic high and logic low, respectively if the logic state stored in the memory cell BC1 is logic high. At the same time, the multiplexing unit MUA2 pulls the write bit lines WBL2 and $\overline{WBL2}$ to logic low and logic high, respectively, when the input signal DIN2 is logic low. On the contrary, the multiplexing unit MUA2 pulls the write bit lines WBL2 and $\overline{WBL2}$ to logic high and logic low, respectively if the input signal DIN2 is logic high.

Next, the word line driving unit 10 activates the write word line WWL, the transistors M9 and M14 are turned on, and the nodes N3 and N4 are pulled to logic high and logic low, respectively, i.e., the input signal DIN2 representing a logic low state is written to the selected memory cell BC2. At the same time, the transistors M1 and M6 are turned on when the write word line WWL is activate, the logic state stored in the unselected memory cell BC1 is maintained at logic low because the nodes N1 and N2 are logic low and logic high, respectively and the write bit lines WBL1 and $\overline{WBL1}$ are logic low and logic high, respectively.

Afterwards, the word line driving unit 10 activates the write word line WWL and the read word line RWL in sequence, and then the selection signal SEL2 is deactivated and the read bit lines RBL1 and RBL2 are pulled to logic high. Finally, the multiplexing units MUA1 and MUA2 pull the write bit lines WBL1 and WBL2 to logic high and pull the write bit lines $\overline{WBL1}$ and $\overline{WBL2}$ to logic low because the read bit lines RBL1 and RBL2 are pulled to logic high.

It should be noted that the read word line RWL is activated before the write word line WWL and is deactivated after the write word line WWL. Namely, the read word line RWL is activated during a first period and the write word line WWL is activated during a second period within the first period. In some embodiments, the read word line RWL and the write word line WWL can also be deactivated at same time.

Because the multiplexing unit MUA1 feedbacks the logic voltages representing the logic state stored in the memory cells BC1 to the write bit lines WBL1 and $\overline{\text{WBL1}}$ before activating the write word line WWL, the logic state stored in the memory cell BC11 is maintained during a memory cell BC2 writing cycle. Namely, when a particular memory cell is selected to be written by an input signal from a data driver, the logic state(s) stored in the unselected memory cell(s) which is/are connected to the same write word line as the selected memory cell is maintained by the corresponding multiplexing unit(s). Thus, the logic states stored in the unselected memory cells is not distorted due to semiconductor process variation. Although operations of the access method are illustrated with reference to single port SRAM shown in FIGS. 4, 5 and 6, the access method can also be applied on two port SRAM.

Certain terms are used throughout the description and claims to refer to particular system components. As one skilled in the art will appreciate, consumer electronic equipment manufacturers may refer to a component by different names. This document does not intend to distinguish between components that differ in name but not function.

Although the invention has been described in terms of preferred embodiment, it is not limited thereto. Those skilled in the art can make various alterations and modifications without departing from the scope and spirit of the invention. Therefore, the scope of the invention shall be defined and protected by the following claims and their equivalents.

What is claimed is:

1. A static random access memory device, comprising:

a memory cell coupled to a read word line, a write word line, a read bit line, a write bit line and a complementary write bit line; and a multiplexing unit coupled to the read bit line, the write bit line and the complementary write bit line to apply first and second logic voltages to the write bit line and the complementary write bit line respectively, when the memory cell is not selected to be written by an input signal from a data driver and the read word line is activated, wherein the first and second logic voltages represent a logic state stored in the memory cell, and the first and second logic voltages are opposite to each other.

2. The static random access memory device as claimed in claim 1, wherein the first logic voltage is output to the read bit line, and the multiplexing unit generates the second logic voltage accordingly and applies the first and second logic voltage to the write bit line and the complementary write bit line, respectively, when the read word line is activated.

3. The static random access memory device as claimed in claim 1, wherein the multiplexing unit applies third and fourth logic voltages representing the input signal to the write bit line and the complementary write bit line, respectively, when the memory cell is selected to be written by the input signal from the data driver.

4. The static random access memory device as claimed in claim 3, wherein the third and fourth logic voltages on the write bit line and the complementary write bit line, respectively, are stored into to the memory cell when the write bit line is activated.

5. The static random access memory device as claimed in claim 1, wherein the multiplexing unit comprises:

a first inverter coupled between the write bit line and the complementary write bit line;

a first tri-state buffer coupled between the complementary write bit line and the read bit line; and a second tri-state buffer coupled between the complementary write bit line and the logic state from the data driver.

6. The static random access memory device as claimed in claim 5, wherein the first and second tri-state buffers are enabled and disabled respectively when the memory cell is not selected to be written by the input signal from the data driver, and the first and second tri-state buffers are disabled and enabled respectively when the memory cell is selected to be written by the input signal from the data driver.

7. An access method for a static random access memory device, wherein the static random access memory device comprises a memory cell coupled to a read word line and a write word line, a read bit line, a write bit line and a complementary write bit line, the method comprising:

activating the read word line during a first time interval;

applying first and second logic voltages representing an input signal from a data driver to the write bit line and the complementary write bit line, respectively, in the first time interval; and activating the write word line in the first time interval to write the first and second logic voltages on the write bit line and the complementary write bit line to the memory cell.

* * * * *